(12) United States Patent
Darwish

(10) Patent No.: US 9,479,123 B2
(45) Date of Patent: Oct. 25, 2016

(54) METHOD AND SYSTEM FOR LINEARIZING AN AMPLIFIER USING TRANSISTOR-LEVEL DYNAMIC FEEDBACK

(71) Applicant: Ali Mohamed Darwish, Laurel, MD (US)

(72) Inventor: Ali Mohamed Darwish, Laurel, MD (US)

(*) Notice: Subject to any disclaimer, the term of this patent is extended or adjusted under 35 U.S.C. 154(b) by 0 days.

(21) Appl. No.: 14/575,373

(22) Filed: Dec. 18, 2014

(65) Prior Publication Data
US 2015/0207467 A1    Jul. 23, 2015

Related U.S. Application Data

(60) Provisional application No. 61/929,015, filed on Jan. 18, 2014.

(51) Int. Cl.
| | | |
|---|---|---|
| *H03F 1/34* | (2006.01) | |
| *H03F 1/32* | (2006.01) | |
| *H03F 1/56* | (2006.01) | |
| *H03F 3/193* | (2006.01) | |
| *H03F 3/24* | (2006.01) | |
| *H03G 1/00* | (2006.01) | |
| *H03G 3/30* | (2006.01) | |

(52) U.S. Cl.
CPC .......... *H03F 1/3247* (2013.01); *H03F 1/3288* (2013.01); *H03F 1/56* (2013.01); *H03F 3/193* (2013.01); *H03F 3/245* (2013.01); *H03G 1/0035* (2013.01); *H03G 3/3036* (2013.01); *H03F 2200/192* (2013.01); *H03F 2200/204* (2013.01); *H03F 2200/222* (2013.01); *H03F 2200/318* (2013.01); *H03F 2200/387* (2013.01); *H03F 2200/411* (2013.01); *H03F 2201/3212* (2013.01); *H03F 2201/3233* (2013.01)

(58) Field of Classification Search
CPC .......................................................... H03F 1/34
USPC .................................................... 330/85, 86
See application file for complete search history.

(56) References Cited

U.S. PATENT DOCUMENTS

| | | | | |
|---|---|---|---|---|
| 3,539,936 A | * | 11/1970 | McGhee | 330/279 |
| 6,933,786 B1 | * | 8/2005 | Mohandas et al. | 330/308 |
| 7,368,987 B2 | * | 5/2008 | Blon | 330/86 |
| 8,299,850 B1 | * | 10/2012 | Kutz et al. | 330/9 |
| 2015/0381129 A1 | * | 12/2015 | Brekelmans | 330/86 |

* cited by examiner

*Primary Examiner* — Henry Choe
(74) *Attorney, Agent, or Firm* — Hojka Qadeer, LLC

(57) ABSTRACT

The present disclosure describes a method and system for linearizing an amplifier using transistor-level dynamic feedback. The method and system enables nonlinear amplifiers to exhibit linear performance using one or more of gain control elements and phase shifters in the feedback path. The disclosed method and system may also allow amplifiers to act as a pre-distorter or a frequency/gain programmable amplifier.

16 Claims, 14 Drawing Sheets

| Control Voltage | Phase |
| --- | --- |
| -3 | 60.0806 |
| -2.75 | 95.30931 |
| -2.5 | 124.5736 |
| -2.25 | 147.736 |
| -2 | 164.8666 |
| -1.75 | 176.2433 |
| -1.5 | 182.3517 |
| -1.25 | 183.8848 |
| -1 | 181.7436 |

METHOD AND SYSTEM FOR LINEARIZING AN AMPLIFIER USING TRANSISTOR-LEVEL DYNAMIC FEEDBACK

CROSS-REFERENCE TO RELATED APPLICATIONS

This application claims priority to U.S. Provisional Patent Appl. No. 61/929,015, filed on Jan. 18, 2014, the disclosure of which is incorporated herein in its entirety by reference.

BACKGROUND

1. Field of the Invention

The present disclosure relates to a method and system for linearizing the performance of amplifiers using transistor-level dynamic feedback.

2. Description of the Related Art

Amplifiers are often treated as linear devices that amplify an input signal via a constant gain factor. It is well understood in the art that amplifiers often possess nonlinear performance above a certain threshold of input power. For example, as the power level of an input signal increases above such a threshold, an amplifier's ability to provide gain will often increasingly degrade. This can result in a distorted output signal from the amplifier due to the low-power elements of the input signal having been amplified with a higher gain factor than the high-power elements of the input signal.

One solution to avoiding nonlinear performance in an amplifier is to restrict input signals to below the threshold where such signals would induce nonlinear distortions. However, this may be undesirable as such a restriction limits the power efficiency that can be obtained when using such an amplifier.

Another approach in the prior art is to use a pre-distortion circuit prior to the amplifier to correct for the nonlinear distortions of the amplifier. For example, if a non-linear amplifier has a gain profile characterized by the function $y=\sqrt{x}$, then using a pre-distortion circuit prior to the amplifier with a gain profile characterized by the function $y=x^2$ should result in linear performance (i.e., $y=x$). The problem with this approach is that it often creates unwanted intermodulation distortion byproducts that arise from small but significant mismatches between the pre-distortion circuit and the nonlinear profile of the amplifier. Such mismatches often occur for a variety of reason, such as the pre-distortion circuit and the amplifier being influenced by environmental factors (e.g., temperature, humidity, or supply voltage fluctuations) or the slow degradation of these devices over time. Another problem with pre-distortion circuits is that they typically consume considerable power. In addition, they often require highly complex and costly designs as they must operate at often very high frequencies and also provide a very high operating bandwidth so that intermodulation distortion byproducts can be canceled out within the amplifier.

SUMMARY

One aspect of the invention is directed to a method, system, apparatus, or media for performing amplification of an input signal using dynamic feedback. For example, in one embodiment, an amplifier may be adapted to amplify the input signal by a gain factor. A feedback path may be coupled to an output and an input of the amplifier for conveying a feedback signal from an output signal of the amplifier to the input of the amplifier. The feedback path may include one or more gain control elements for adjusting the magnitude of the feedback signal and a controller may be coupled to the input of the amplifier (prior to the feedback path) and further coupled to the one or more gain control elements. In such an embodiment, the controller may be adapted to apply control voltages to the one or more gain control elements, such that the amplifier may provide a constant gain factor and a constant relative phase shift over a previously nonlinear operating range of the amplifier without dynamic feedback.

DETAILED DESCRIPTION OF THE DRAWINGS

DETAILED DESCRIPTION OF THE PREFERRED EMBODIMENTS

Figure 1:
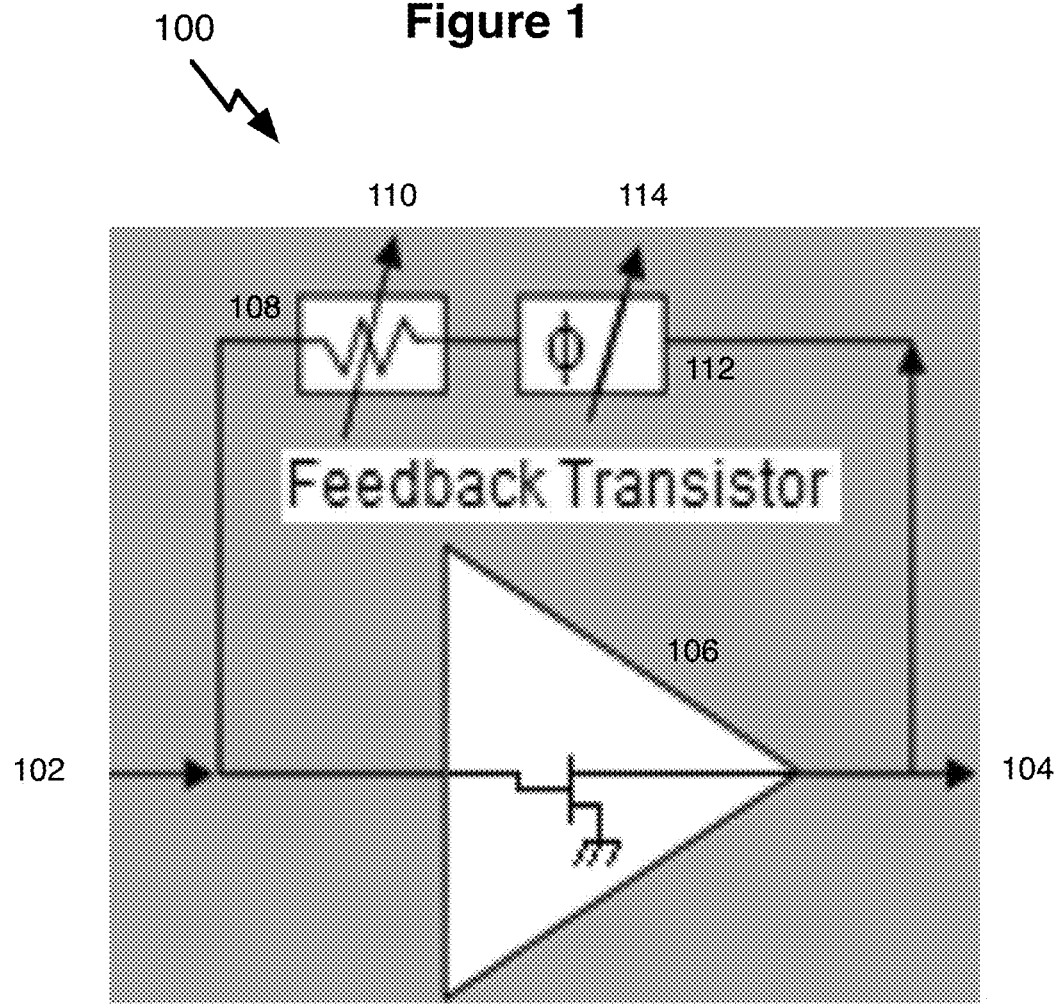
FIG. 1 illustrates a circuit 100 for performing signal amplification with dynamic feedback.

FIG. 1 shows an example of a circuit 100 for performing signal amplification. In circuit 100, amplifier 106 may be used to amplify input signals received via input port 102. The amplified signal may be received via output port 104. It is well known in the art that amplifiers often possess a linear range for amplification. For example, if input signals received by amplifier 106 via input port 102 are within such a linear range, then the amplified signal received via output port 104 will remain in linear proportion to the input signals (e.g., y=Gx, where y is the output signal, x is the input signal, and G is a constant gain factor supplied by amplifier 106). However, if such input signals exceed the linear range of amplifier 106, then the amplified signal received via output port 104 may exhibit nonlinear distortions.

For example, one nonlinear distortion is gain compression. As an input signal increases above the linear range, the ability of an amplifier to amplify the signal by a constant gain factor will increasingly degrade. Another example of nonlinear distortion is phase rotation. As an input signal increases above the linear range, the ability of an amplifier to maintain the correct relative phase of the signal will increasingly degrade in relation to lower power input signals. These and other nonlinear distortions can substantially degrade the performance of amplifier 106, such that the use of bandwidth-efficient signaling schemes may become considerably impaired. While ensuring that input signals to amplifier 106 stay within the linear range of amplifier 106 avoids any nonlinear distortions, it also reduces the power efficiency of amplifier 106 compared to that of an ideal amplifier that exhibits only linear performance.

Figure 2:
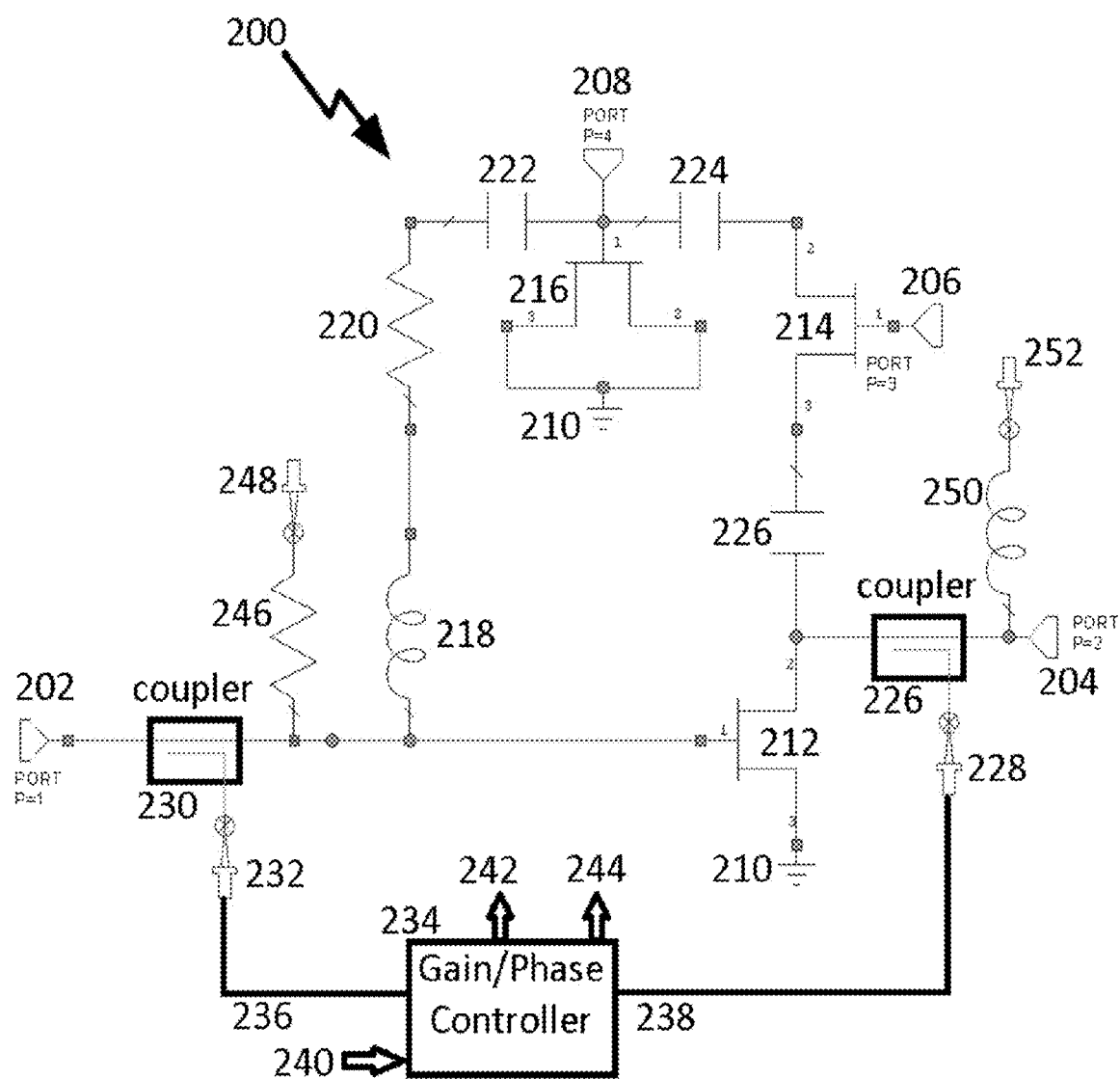
FIG. 2 illustrates a circuit 200 that may be implemented for performing signal amplification with dynamic feedback.

FIG. 2 shows an example of a circuit 200 that may used to implement circuit 100 and thus may provide for transistor-level dynamic feedback. In circuit 200, a feedback path may be added between input port 202 and output port 204. Such a feedback path may be composed first of transistor 214 connected to output port 204 through capacitor 226. Resistance control port 206 may be connected to the gate terminal of transistor 214 for applying a control voltage. By varying the control voltage applied via resistance control port 206, transistor 214 may act like a gain control element in the feedback path, thereby allowing for adjusting the gain factor of transistor 212. It should be appreciated that when a transistor is used in passive mode (meaning that it has almost equal voltage on its drain and source), it may act like a resistor connected between the drain and source terminals. The value of the resistor may be set using the gate voltage (relative to the drain/source terminals). Additionally, one may connect multiple resistors in series to obtain higher values of resistance. In the same manner, one may connect multiple passive transistors in series to obtain a larger value of resistance. In that case, each series transistor may be controlled independently through its resistance control port (e.g., its gate terminal). Hence, transistor 214 which may be controlled through port 206 may be replaced with a set of series transistors each having its own resistance control port. Having multiple resistance control ports may give higher flexibility in controlling the gain of transistor 212.

From transistor 214, the feedback path may continue through capacitor 224 to phase control port 208. Phase control port 208 may be connected to the gate terminal of transistor 216 for applying a control voltage. By varying the control voltage applied via phase control port 208, transistor 216 may act like a variable capacitor in the feedback path, thereby allowing for adjusting the relative phase shift of transistor 212. In circuit 200, transistor 216 may have its drain and source terminals connected to ground 210. From phase control port 208, the feedback path may continue through an RLC circuit to input port 202. An example of such an RLC circuit is shown with inductor 218, resistor 220, and capacitor 222 connected in series. In circuit 200, the transistor gate bias may come through port 248 which may have a series resistor (246) to isolate the gate bias from the signal (RF) path. Additionally, drain bias may come through port 252 which may have a series inductor (250) to isolate the drain bias from the signal (RF) path. In addition, the input power may be sensed at port 232 through coupler 230. The output power may be sensed at port 228 through coupler 226. A gain/phase controller (234) may have inputs and outputs. The inputs may include one or more of the input power (such as sensed at port 236 of the controller), the output power (such as sensed at port 238 of the controller), and environmental signals such as temperature and humidity (such as sensed at port 240 of the controller). The gain/phase controller (234) may have one or more outputs, such as 242 and 244, which may drive the phase control (208) and resistance control (206) to achieve the desired performance.

Gain/phase controller 234 may contain software or hardware for performing the functions described herein, such as methodology 300. For example, gain/phase controller 234 may contain one or more processors and memory. Gain/phase controller 234 may be implemented by a variety of devices, such as digital signal processors, FPGA, custom ASICs, PICs, etc.

With respect to circuit 200 described above, an input signal (e.g., QAM, QPSK) may be applied to input port 202. Transistor 212 then may amplify the output signal, a portion of which may be sent back via the feedback path as a feedback signal. Depending on the state of the input signal, the feedback signal may result in positive or negative feedback that adjusts the gain factor or relative phase shift of the input and output signals of transistor 212. By adjusting the voltages applied to resistance control port 206 or phase control port 208, the amount of attenuation and capacitance in the feedback path can be adjusted, thereby allowing for the gain factor and relative phase shift between the output (at 204) and the input (at 202) of transistor 212 to be held constant for all power levels of an input signal. Consequently, control voltages applied to resistance control port 206 or phase control port 208 may be adjusted for each power level of the input signal such that small and large signal inputs experience a similar response from transistor 212. This allows for a linearized operation of transistor 212 through dynamic feedback control and may prevent the generation of unwanted intermodulation distortion byproducts (e.g., third-order intermodulation distortion).

Figure 3:
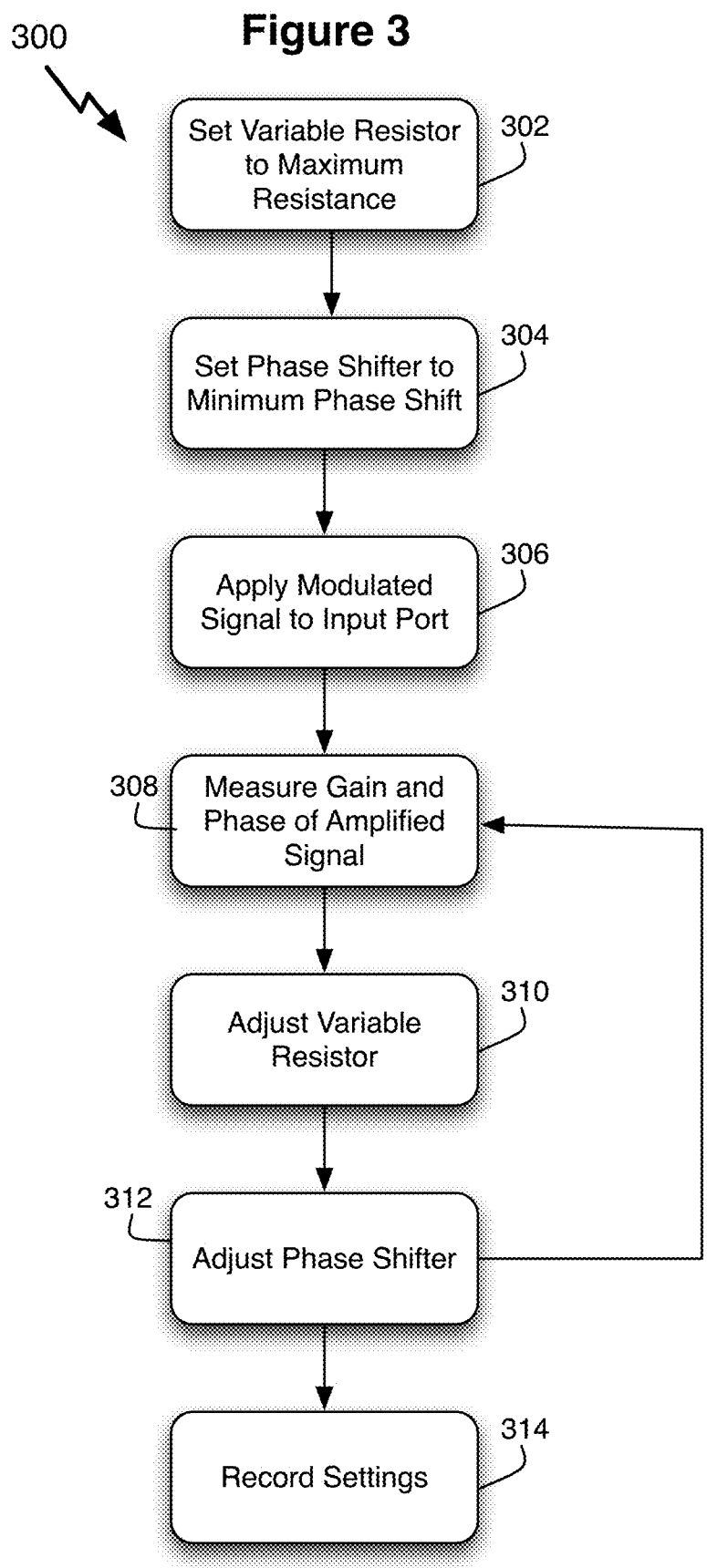
FIG. 3 shows an example of a methodology that illustrates how one may find the control voltages for gain or phase adjustments.

FIG. 3 shows a methodology 300 for constructing a lookup table for a modulation signal of a specific power level that may be applied to circuit 100. At step 302, gain control element 108 of circuit 100 may be set to its maximum resistance setting via resistance control port 110. At step 304, phase shifter 112 of circuit 100 may be set to its minimum phase shift setting via phase control port 114. At step 306, a modulated signal (e.g., QPSK, 16QAM) having a specific power level may be applied to input port 102 of circuit 100. At step 308, the modulated signal after amplification may be measured at output port 104 in order to obtain a complex transfer function describing the behavior of the amplifier. This complex transfer function may be represented for example as a gain factor and relative phase shift. If variable resister 108 is set to its maximum resistance setting and phase shifter 112 is set to its minimum phase shift setting, this complex transfer function describes the performance of the amplifier without feedback for the modulated signal having a specific power level.

To characterize the performance of the amplifier with feedback for the modulated signal having a specific power level, methodology 300 may proceed to step 310 where gain control element 108 may be adjusted to a new value. In addition, methodology 300 may proceed to step 312 where phase shifter 112 may be adjusted to a new value. Once gain control element 108 or phase shifter 112 is set to a new value, methodology 300 may return to step 306 as described above. If the new setting(s) for gain control element 108 or phase shifter 112 do not result in the desired complex transfer function, then steps 308 through 312 may be repeated until optimum settings for gain control element 108 or phase shifter 112 are obtained. Once such optimum settings are found, they may be recorded at Step 314. In some embodiments, recording the settings may include the power level of the input signal. Moreover, methodology 300 may be repeated using an input power signal at different power levels to construct a lookup table using the information recorded at step 314.

Figure 3A:
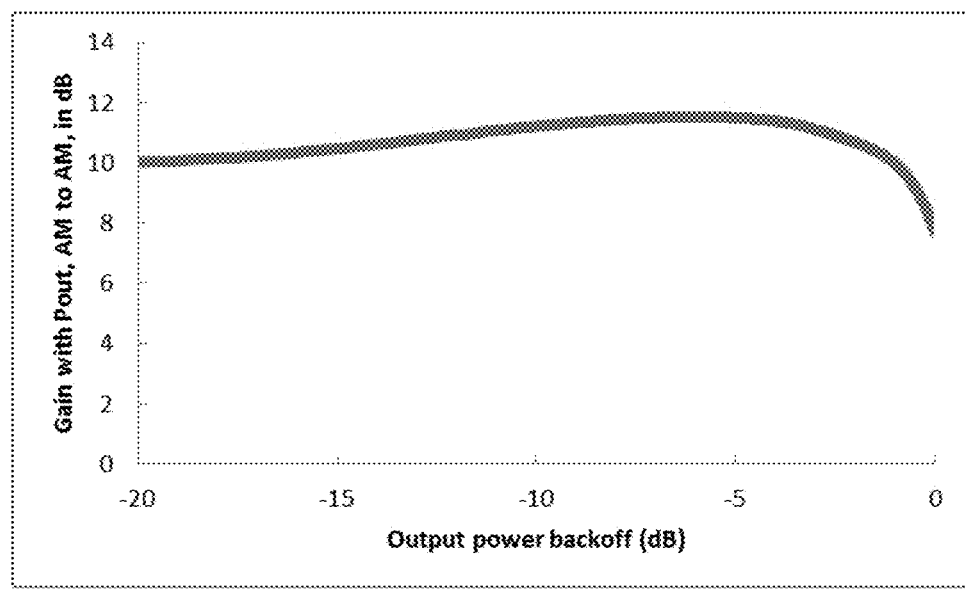
FIG. 3A shows an example of a gain profile for an amplifier without dynamic feedback.
Figure 3B:
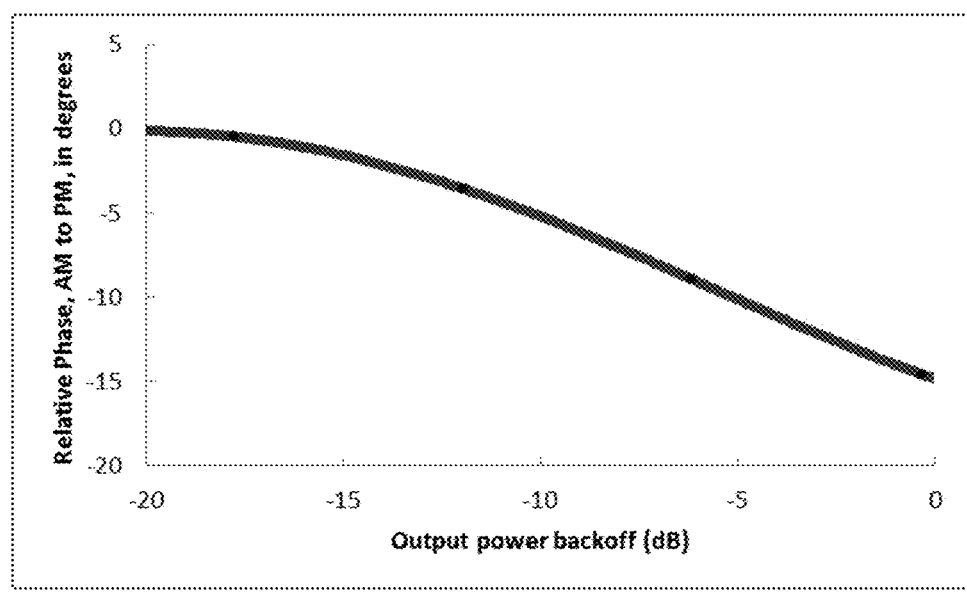
FIG. 3B shows an example of relative phase shift profile for an amplifier without dynamic feedback.

FIGS. 3A and 3B show examples of an amplifier's gain and phase profiles using circuit 200. Both figures were obtained by setting the gain control element (in the form of transistor 214) to maximum resistance and the phase shifter (in the form of transistor 216) to minimum phase shift and applying a 1 GHz continuous wave modulated signal at different power levels. FIG. 3A shows that the gain factor of the amplifier gradually increases from −20 dB to −5 dB output power back off. Between −5 dB and 0 dB output power back off, the gain factor of the amplifier severely degrades. FIG. 3B shows the relative phase shift induced by the amplifier from −20 dB to 0 dB output power back off. While some systems may be able to tolerate a small amount of phase shift induced by an amplifier, FIG. 3B shows that as input power approaches 0 dB output power back off the relative phase shift becomes more severe.

Methodology 300 may be used to linearize such an amplifier with the characteristics shown in FIGS. 3A and 3B. For example, after characterizing the behavior of the amplifier as shown in FIGS. 3A and 3B, one may decide to linearize the performance of the circuit from −20 dB to 0 dB output power back off. In terms of gain, the amplifier's uncorrected lowest gain factor shown in FIG. 3A is 7.7 dB at 0 dB power output back off. Thus, one may decide to linearize the amplifier across −20 dB to 0 dB output power back off to provide a constant gain level of 7.7 dB. However, should one decide to operate the amplifier in a different range (e.g., −20 dB to −5 dB output power back off), the uncorrected lowest gain factor in such a range would be considerably higher, thus allowing for a higher constant gain factor (around 10 dB) within that range. Accordingly, it should be understood that the methods and systems described herein can be adapted to a variety of different ranges of input power to achieve different gain factors.

Figure 4:
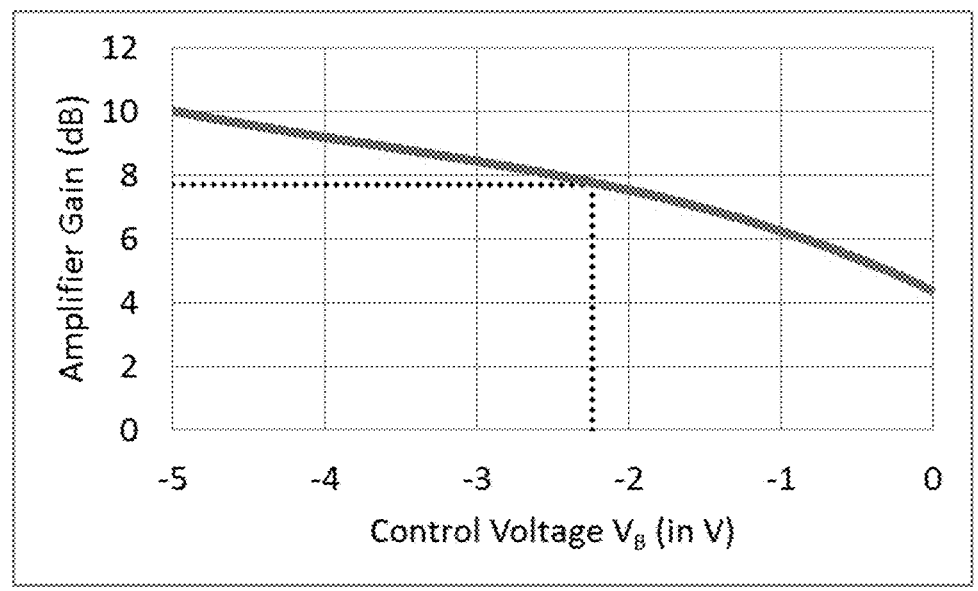
FIG. 4 shows an example of the gain of an amplifier for a given input signal based on variation of a control voltage applied to a gain control element.
Figure 5:
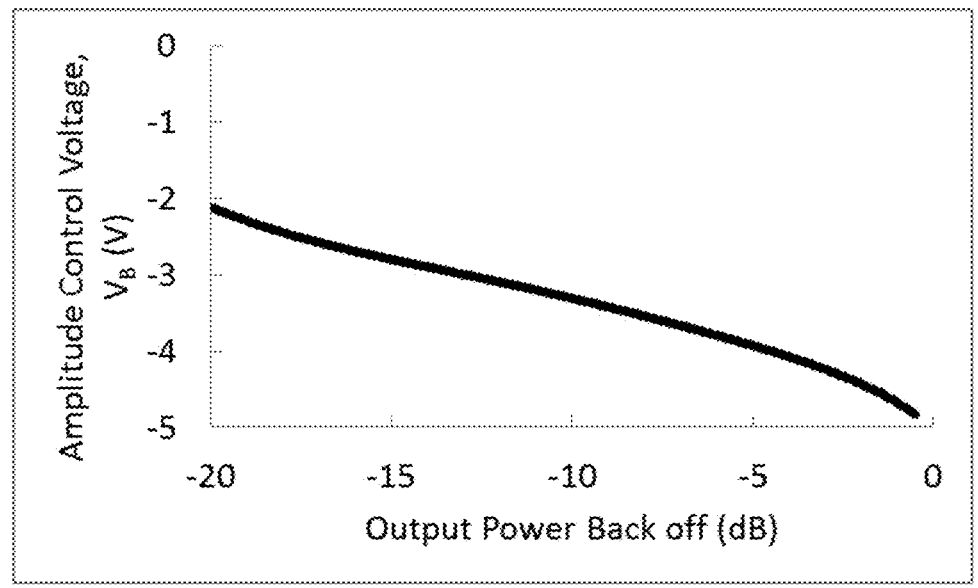
FIG. 5 shows an example of the control voltages required for given output power back offs to achieve a desired constant gain level.

In accordance with methodology 300, settings for the gain control element may be determined for a given input power to obtain the desired output power. For example, FIG. 4 shows the amplifier gain for a continuous wave modulated signal at input power of −20 dB output power back off as the gain control element of circuit 200 is varied via a varying control voltage. FIG. 4 shows that applying a control voltage between 0 V to −5 V causes the amplifier's gain to vary from around 10 dB to slightly over 4 dB. To achieve a gain factor of 7.7 dB for the input signal at −20 dB output power back off, FIG. 4 shows that a control voltage of −2.125 V for the gain control element is required. This process can be repeated for input signals at a variety of power levels (e.g., −19 dB, −18 dB, −17 dB, . . . , 0 dB output power back off) to obtain respective control voltages to maintain a constant gain of 7.7 dB at different power levels. For example, FIG. 5 shows a graph of control voltages to be applied to the gain control element as the input signal varies from −20 dB to 0 dB output power back off.

Figures 16A, 16B:
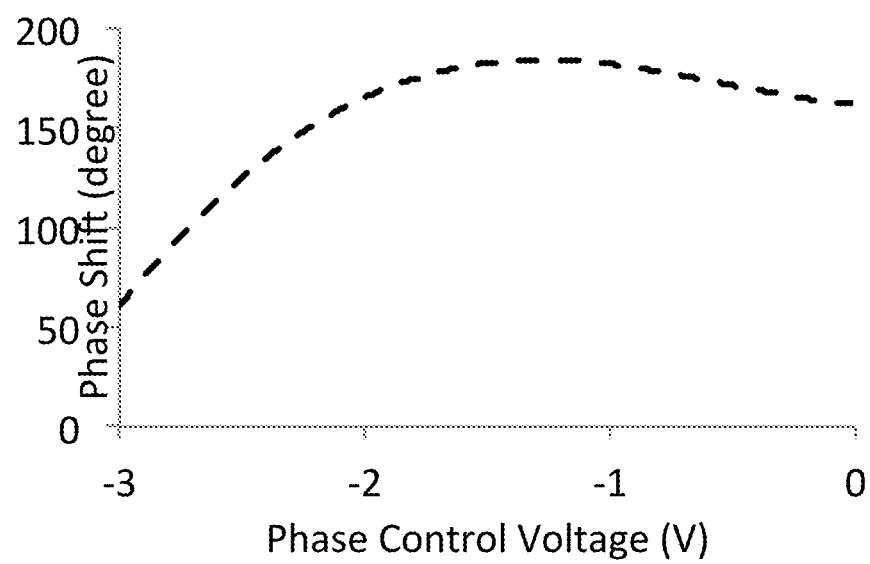
FIG. 16A shows an example table of the control voltages required for given output power back offs to achieve a desired constant relative phase shift.
FIG. 16B shows an example chart of the control voltages required for given output power back offs to achieve a desired constant relative phase shift.

In a similar fashion to the process above, control voltages for the phase shifter can also be determined for input signals at a variety of power levels to maintain a desired relative phase shift. For example, FIG. 16A shows the control voltages that may be used to achieve a 0 degree relative phase shift using circuit 200 as above, which was obtained via methodology 300. These control voltages that may be used with the phase shifter of circuit 200 are graphed in FIG. 16B.

Figure 6A:
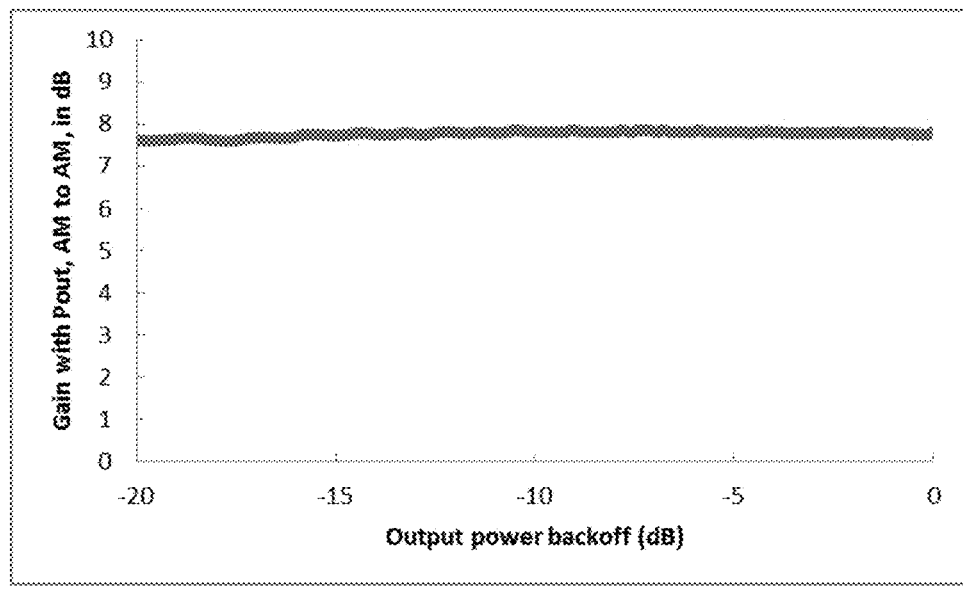
FIG. 6A shows an example of a corrected gain profile for an amplifier with dynamic feedback.
Figure 6B:
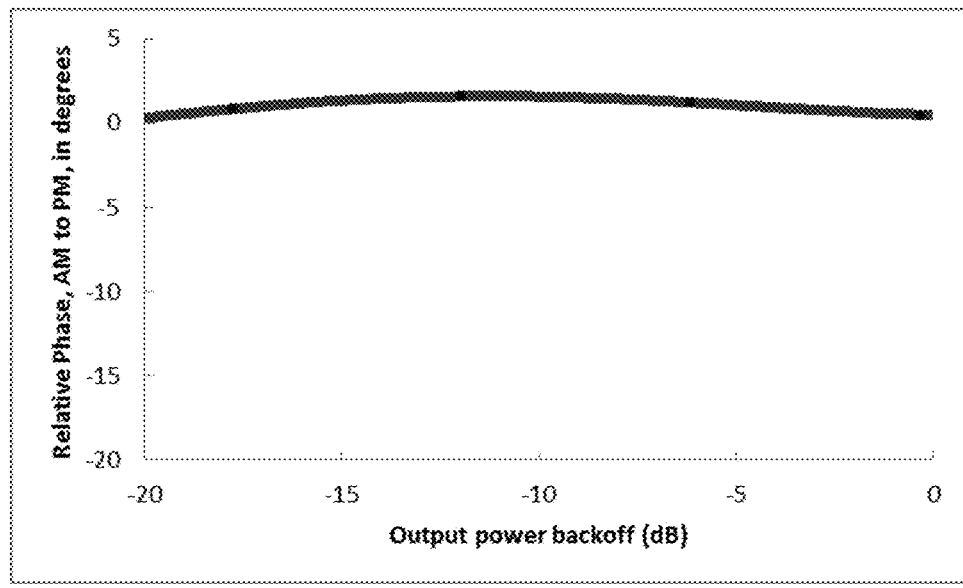
FIG. 6B shows an example of a corrected relative phase shift profile for an amplifier with dynamic feedback.
Figure 7:
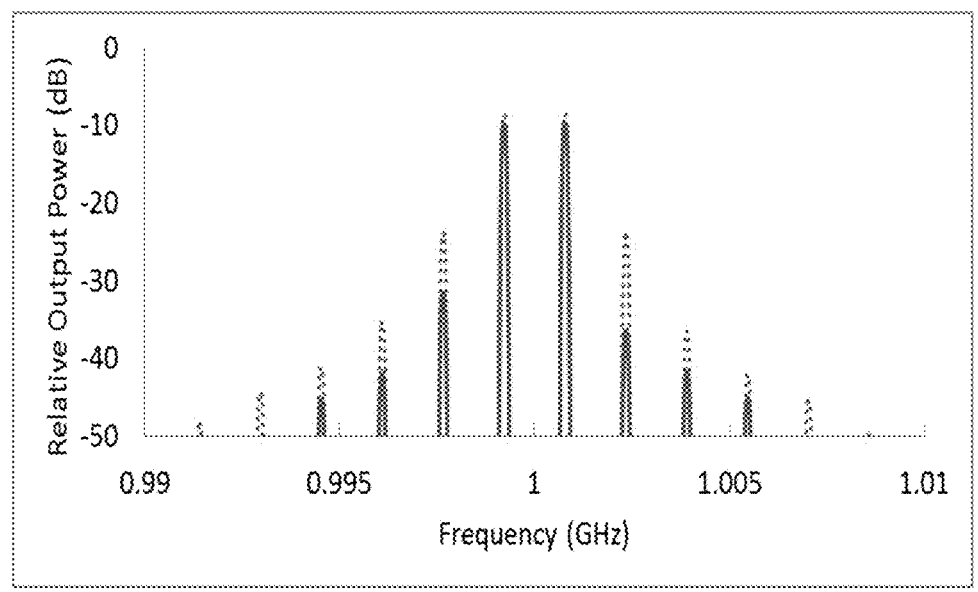
FIG. 7 shows an example of the presence of intermodulation distortion byproducts using an amplifier with and without dynamic feedback.

After determining the appropriate control voltages for an input signal operating within a certain rage of output power back off, these control voltages can be applied to the resistance control port and the phase control port to linearize the performance of the transistor. For example, control voltages obtained using the processes described above can be used to linearize the performance of the amplifier described in accordance with FIGS. 3A and 3B. The result of using such control voltages with such an amplifier is shown in FIGS. 6A and 6B. FIG. 6A shows that the corrected gain of the amplifier is now relatively constant at 7.7 dB over the range of 0 dB to −20 dB output power back off. FIG. 6B shows that the corrected relative phase shift of the amplifier is now relatively constant at 0 degrees over the range of 0 dB to −20 dB output power back off. In addition to corrected gain factor and relative phase shift, FIG. 7 shows that the methods described herein result in improved suppression of intermodulation distortion by productions. The dotted line is the spectrum of an output signal when an amplifier is operated without feedback (e.g., setting the gain control element to maximum resistance and the phase shifter to minimum phase shift). The solid line is the spectrum of an output signal when the amplifier is operated using feedback as disclosed herein. The use of control voltages to a gain control element or phase shifter to shape a feedback signal may require transistors with a fast response rate. For example, for an RF or microwave signal with a 10 MHz modulation signal (time constant equivalent to 100 ns), an amplifier's characteristics may change at a 100 ns time scale. Consequently, in order to use control voltages determined by methodology, transistors which can respond faster than the time in which an amplifier's characteristics may change may be required.

Figure 8:
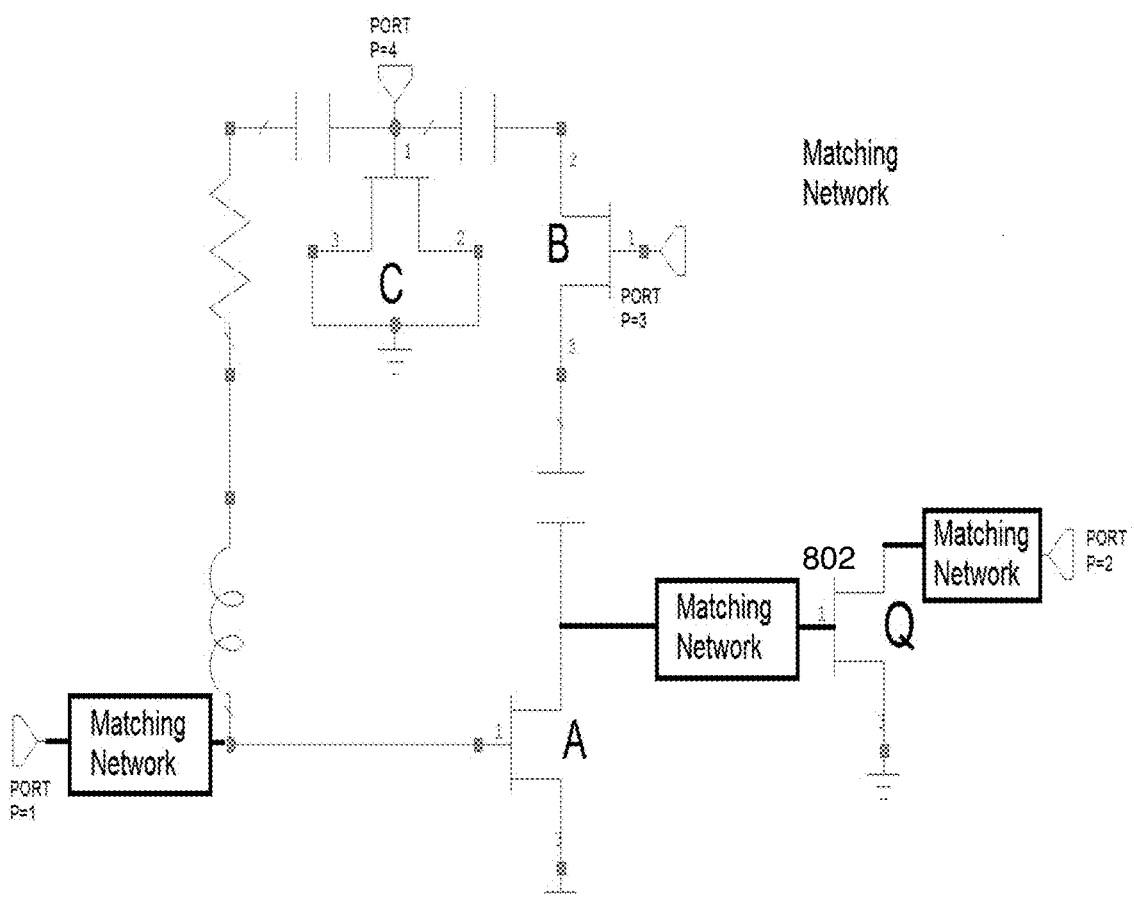
FIG. 8 illustrates an example of using circuit 200 as a pre-distorter for a subsequent nonlinear amplifier.
Figure 9A:
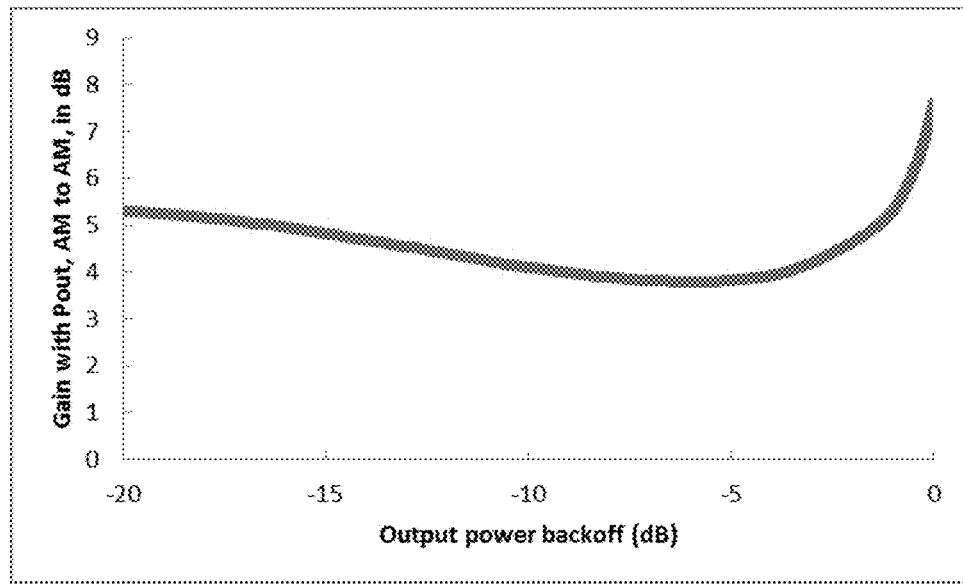
FIG. 9A shows an example of a desired gain profile of a pre-distorter.
Figure 9B:
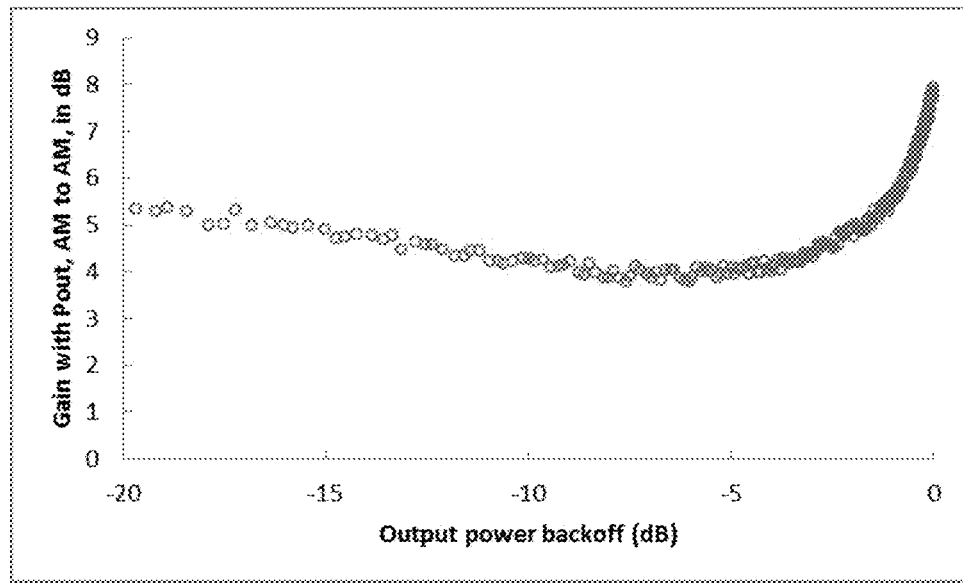
FIG. 9B shows an example of the actual gain profile obtained for a pre-distorter using circuit 200.
Figure 10:
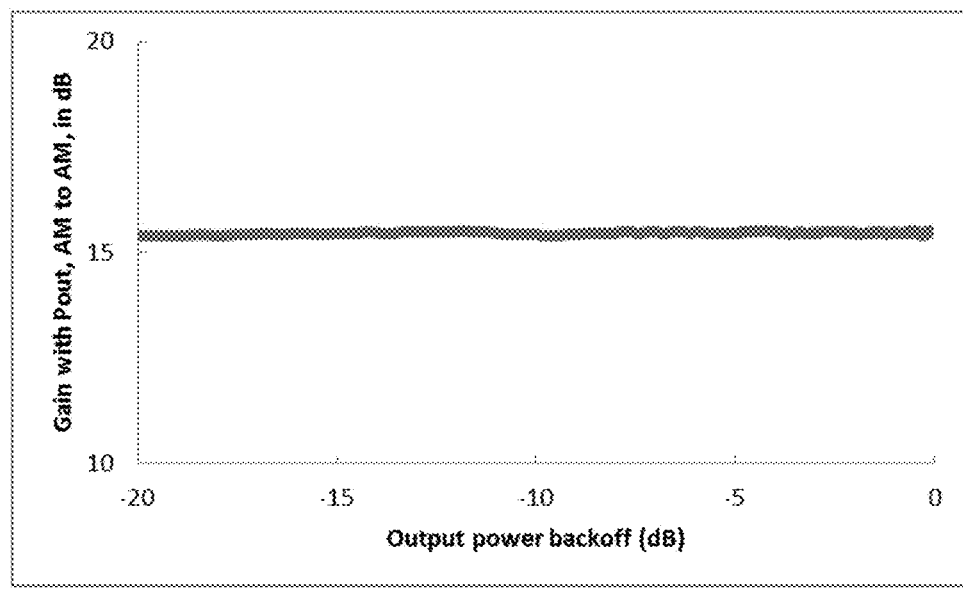
FIG. 10 shows an example of a corrected gain profile for a signal applied to a pre-distorter and amplifier.

In some embodiments, the methods and systems disclosed herein may be used to implement a pre-distorter. For example, circuit 200 may be implemented as shown in FIG. 8 prior to an amplifier 802 (shown in the form of transistor Q). If amplifier 802 has the characteristics as described with respect to FIGS. 3A and 3B, then one may wish to use a pre-distortion circuit with the gain profile shown in FIG. 9A to compensate for variations in the gain profile of amplifier 902. Using the methods and systems described above, control voltages for a desired gain profile (e.g., the gain profile shown in FIG. 9A) may be determined for the desired range of input power. FIG. 9B shows an example of the actual gain profile of circuit 200 after such control voltages have been determined. By cascading circuit 200 as a pre-distorter prior to amplifier 802 and using such control voltages, nearly constant gain level using these two elements can be achieved as shown in FIG. 10. In a similar fashion, the pre-distortion technique disclosed herein can be used to determine and utilize control voltages for obtaining a desired relative phase shift profile.

Figure 11:
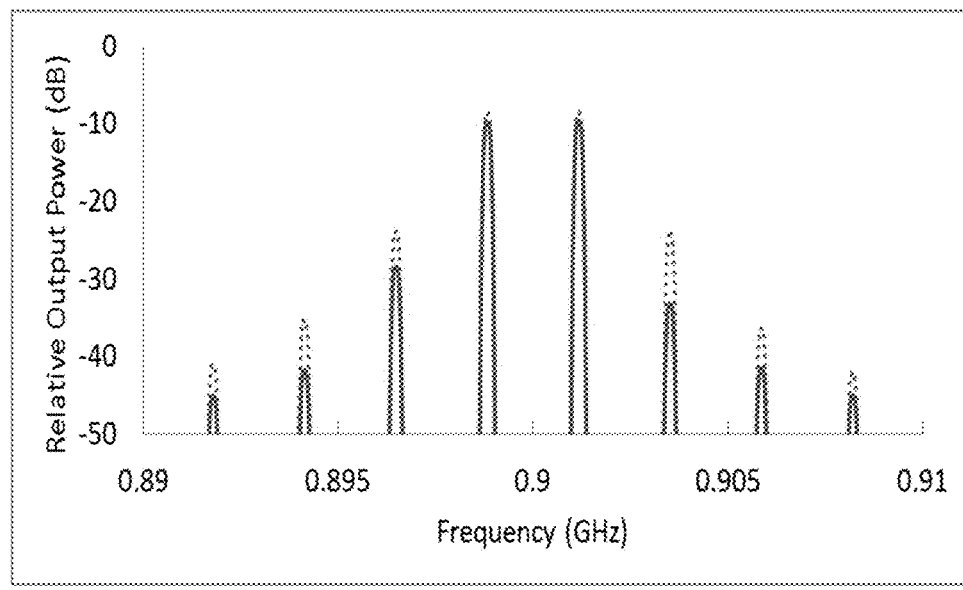
FIG. 11 shows an example of the presence of intermodulation distortion byproducts using an amplifier with and without a pre-distorter.

In addition to corrected gain and relative phase shift, FIG. 11 shows that the use of circuit 200 as a pre-distorter may result in improved suppression of intermodulation distortion by productions. The dotted line is the spectrum of an output signal when an amplifier (902) is operated without pre-distortion as described herein. The solid line is the spectrum of an output signal when amplifier 902 is operated with pre-distortion as described herein.

In some embodiments, the methods and systems disclosed herein may be used for providing a frequency/gain programmable amplifier. For example, circuit 100 (or circuit 200) may be adjusted via a phase shifter in the feedback path (e.g., phase shifter 112) such that the path length of the feedback path varies. Adjusting the path length may be used to determine the phase of the feedback signal when it combines with the input signal. For example, if the feedback path is selected such that the phase of the feedback signal upon combination with the input signal is 360 degrees, this will result in positive feedback. Alternatively, if the feedback path is selected such that the phase of the feedback signal upon combination with the input signal is 180 degrees, this will result in negative feedback. In addition, by increasing or decreasing the resistance of a gain control element in the feedback path (e.g., gain control element 108), the magnitude of any positive or negative feedback can be adjusted. Consequently, for an input signal with a given frequency, control voltages may be determined and used herein to increase or decrease the gain of an amplifier (e.g., amplifier 106).

Figure 12:
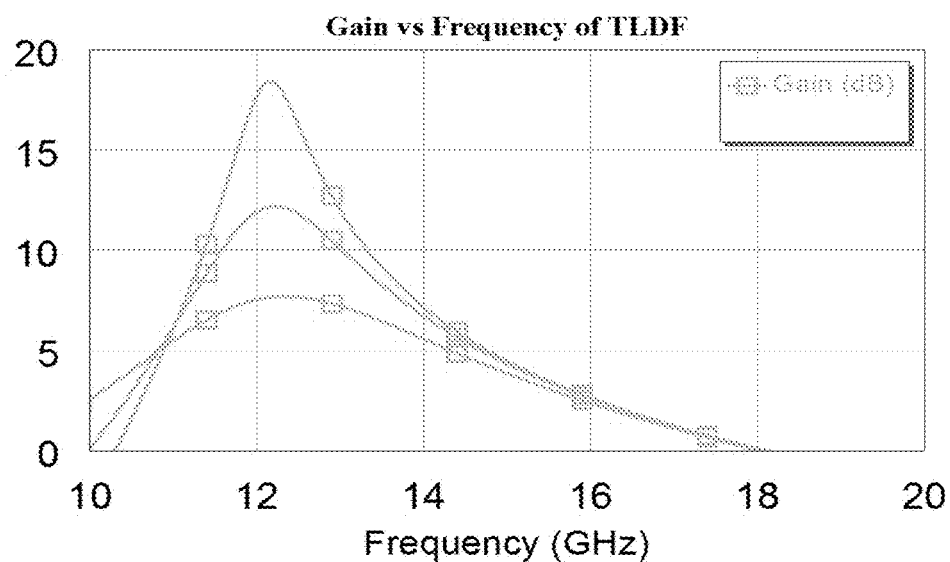
FIG. 12 shows an example of how a gain control element in the feedback path may be adjusted to increase or decrease gain of an amplifier at a specific frequency.
Figure 13:
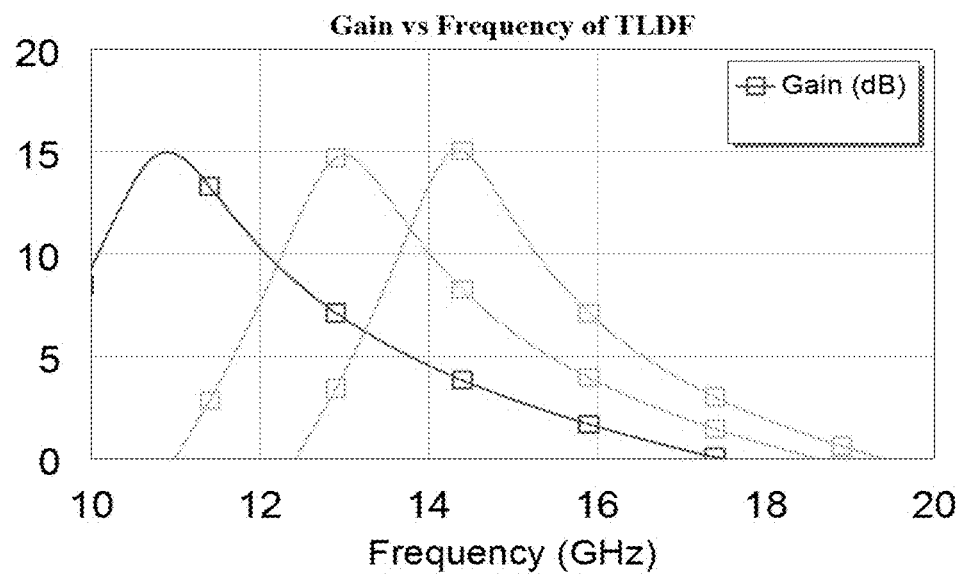
FIG. 13 shows an example of how a phase shifter in the feedback path may be adjusted to shift the gain profile of an amplifier across a frequency spectrum.

For example, FIG. 12 shows a situation where a control voltage was applied to phase shifter 112 so that feedback path length was optimized for a 12 GHz input signal (i.e., the path length of the feedback path was 360 degrees for a 12 GHz signal). In addition, FIG. 12 shows the effect of setting the gain control element to three different levels of resistance, thereby changing the magnitude of the feedback signal. In the situation where the control voltage was set to induce the gain control element to a low resistance, the gain of the amplifier can be seen to be around 18 dB, while control voltages that corresponded to higher resistance settings resulted in lower gain. FIG. 13 shows how adjusting the control voltage applied to a phase shifter in the feedback path shifts the gain profile of the amplifier in terms of frequency for three different settings. Consequently, using the methods and systems described above, control voltages may be determined and used to provide a specific gain for an input signal at a particular frequency.

Figure 14:
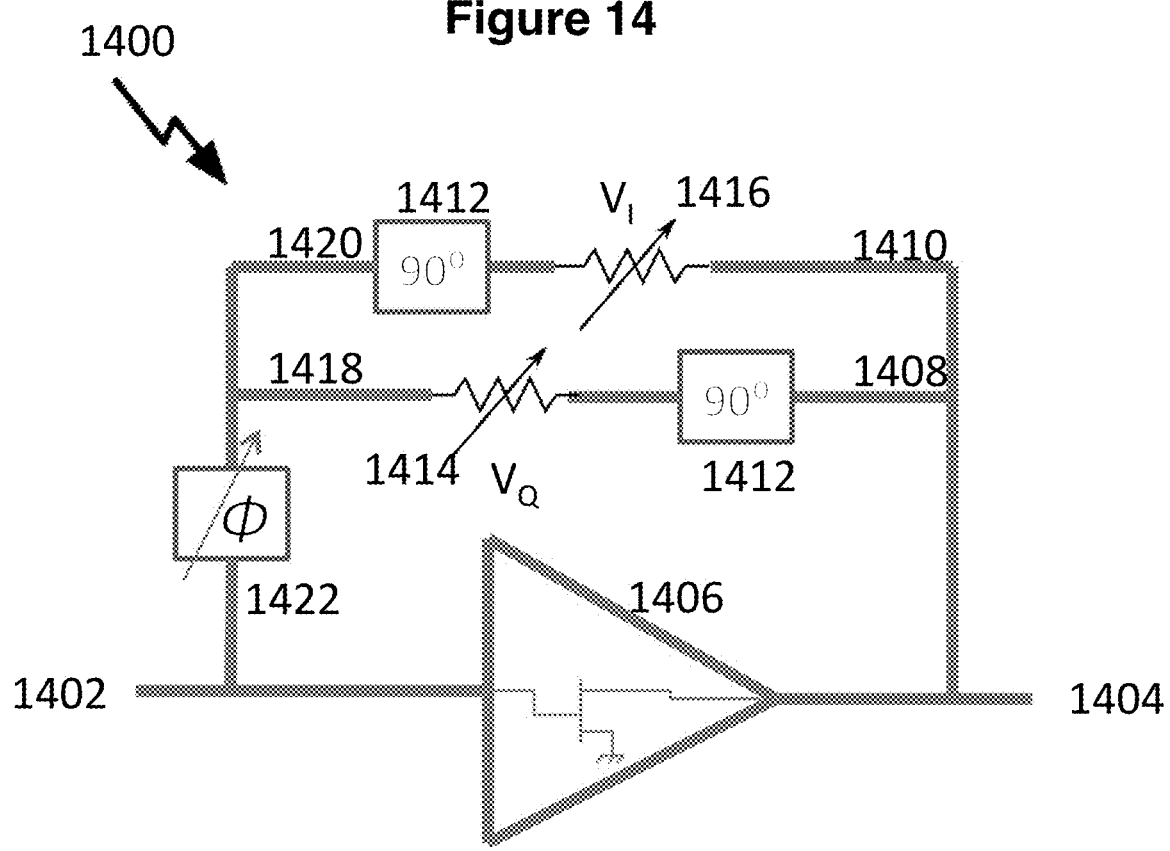
FIG. 14 illustrates a circuit 1400 for performing signal amplification with dynamic feedback.

In some embodiments, the feedback may be implemented using two gain control elements, instead of gain and phase control elements. Circuit 1400, shown in FIG. 14, shows such an example of such an implementation. The input signal may enter through port 1402, may be amplified by transistor 1406, and may exit at port 1404. Part of the output signal (at 1404) may be fed back to the input through a feedback path where it may be split equally between two branches (1408 and 1410). Branch 1410 may act on the original signal (the so-called I-component of the signal), while branch 1408 has a 90 degree phase shift (1412) and may act on the 90-degree-shifted signal (the so-called Q-component of the signal). In branch 1410, the amplitude of the I-signal may be controlled using a gain control element (1416), while in branch 1408, the amplitude of the Q-signal may be controlled using a gain control element (1414). Afterwards, the I-signal may be shifted by a 90 degree shift (1412) and may exit at 1420, while the Q-signal may exit at 1418 without further phase shifts. Then, the I-signal and Q-signal may be combined and phase shift 1422 may be added, after which the signal may be combined with the input signal (at 1402) prior to transistor 1406. A direct relationship between gain/phase variations and I/Q variations can be obtained by this approach. Mathematically, one can write:

$$A\cos(2\pi ft+\phi)=A\cos(2\pi ft)\cos(\phi)-A\sin(2\pi ft)\sin(\phi)$$

defining I and Q as $$I=A\cos(\phi)$$

$$Q=-A\sin(\phi)=A\cos(\phi+\pi/2)$$

Then $$A\cos(2\pi ft+\phi)=I\cos(2\pi ft)+Q\sin(2\pi ft)$$

Hence, one may represent a gain/phase variation as an I/Q variation. Methodology 300 may then be used to find control voltages for the gain control elements of circuit 1400. Circuit 1400 may include a controller for performing methodology 300.

Figure 15:
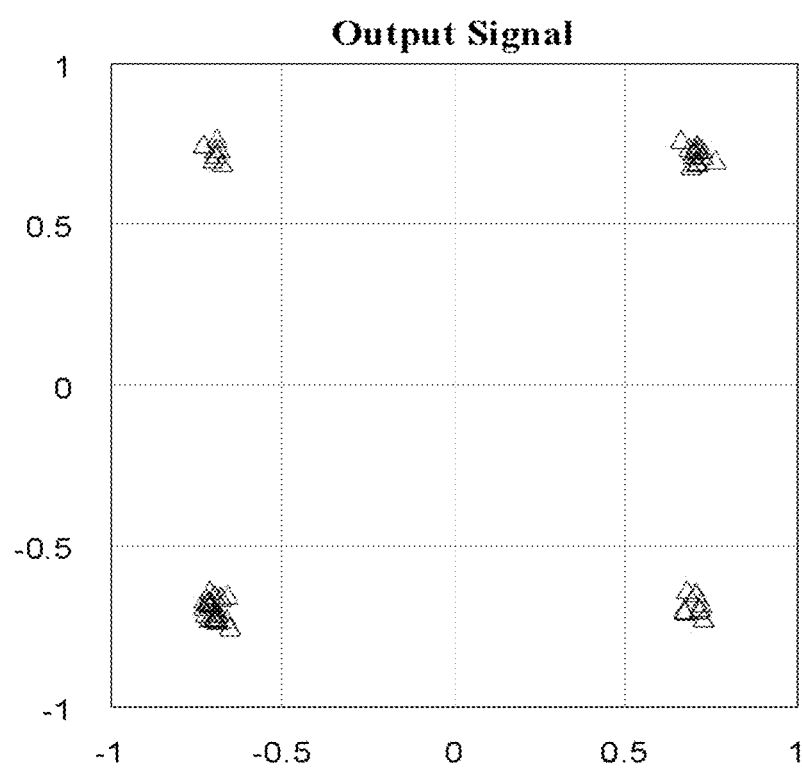
FIG. 15 shows an example of signal modulation.

In some embodiments, the methods and systems disclosed herein may be used to implement a modulator. A modulator may impose a varying phase and amplitude on an input signal exhibiting a constant amplitude and phase. For example, circuit 100 (or circuit 200) may be adjusted via a phase shifter in the feedback path (e.g., phase shifter 112) or adjusted via a gain control element in the feedback path (e.g., gain control element 108) to impose a phase shift or an amplitude change on an input signal exhibiting a constant amplitude and phase. As an example, circuit 200 was driven with a constant input signal while the phase control was driven by QPSK signal. FIG. 15 shows the resulting signal constellation diagram received at output port 204.

It is to be understood that the methods and systems described herein can be used for a variety of input signals (e.g., QPSK, QAM). In addition, the table lookup of control voltages to be applied to the resistance control port and phase control ports can be determined and utilized using additional factors beyond output power back-off, such as the temperature of the amplifier, the length of time the amplifier has been operating, the prior state(s) of the input signal at a fixed interval(s), etc. These may be determined using methodology 300, such as via a controller, by additionally adjusting such parameters. Consequently, tables may be constructed that allow, such as via a controller, application of a control voltage to a gain control element or phase shifter based on such parameters.

Numerous variations and modifications will become apparent to those skilled in the art once the above disclosure is fully appreciated. For example, one skilled in the art will understand that a variety of different transistors or other elements may be used to implement an amplifier using a dynamic feedback path as disclosed herein (e.g., a gain control element may be implemented using variable resistors, variable capacitors, inductors, active semiconductor devices, etc.). In addition, those skilled in the art will understand that a variety of different feedback paths may be used in accordance with the above disclosure. For example, methodology 300 may be used in any one or more feedbacks path where gain control elements or phase shifters allow for the adjustment of the phase and magnitude of the feedback signal. It is intended that the following claims be interpreted to embrace all such variations and modifications.

What is claimed is:

1. A device for performing amplification of an input signal using dynamic feedback comprising:
    an amplifier adapted to amplify the input signal by a gain factor;

one or more feedback paths coupled to an output and an input of the amplifier for conveying a feedback signal from an output signal of the amplifier to the input of the amplifier, wherein the one or more feedback paths includes one or more gain control elements for adjusting the magnitude of the feedback signal; and a controller coupled to the input of the amplifier prior to the one or more feedback paths and further coupled to the one or more gain control elements in the one or more feedback paths, wherein the controller is adapted to apply control voltages to the one or more gain control elements based on a lookup table containing control voltages to be applied to the one or more gain control elements based on the input signal and one or more of the output signal, a temperature of the amplifier, a length of time the amplifier has been operating, a prior state of the input signal, a supply voltage to the amplifier, and humidity.

2. The device of claim 1, further comprising:
one or more phase shifters in the one or more feedback paths for adjusting the phase of the feedback signal, wherein the one or more phase shifters in the one or more feedback paths are coupled to the controller and the controller is adapted to apply control voltages to the one or more phase shifters.

3. The device of claim 1, wherein the one or more gain control elements can change state faster than rate at which the amplifier's characteristics may change.

4. The device of claim 2, wherein the one or more phase shifters can change state faster than rate at which the amplifier's characteristics may change.

5. The device of claim 1, wherein the one or more gain control elements are used with one or more fixed phase shift elements for adjusting the magnitude or phase of the feedback signal.

6. A system for performing amplification of an input signal using dynamic feedback comprising:
an amplifier component adapted to amplify the input signal by a gain factor;
one or more feedback components coupled to an output and an input of the amplifier component for conveying a feedback signal from an output signal of the amplifier component to the input of the amplifier component, wherein the one or more feedback components includes one or more gain control element components for adjusting the magnitude of the feedback signal; and
a controller component coupled to the input of the amplifier component prior to the one or more feedback components and further coupled to the one or more gain control element components in the feedback path, wherein the controller component is adapted to apply control voltages to the one or more gain control element components based on a lookup table containing control voltages to be applied to the one or more gain control elements based on the input signal and one or more of the output signal, a temperature of the amplifier, a length of time the amplifier has been operating, a prior state of the input signal, a supply voltage to the amplifier, and humidity.

7. The system of claim 6, further comprising:
one or more phase shifter components in the one or more feedback components for adjusting the phase of the feedback signal, wherein the one or more phase shifter components in the one or more feedback components are coupled to the controller component and the controller component is adapted to apply control voltages to the one or more phase shifter components.

8. The system of claim 6, wherein the one or more gain control element components can change state faster than rate at which the amplifier component's characteristics may change.

9. The system of claim 7, wherein the one or more phase shifter components can change state faster than rate at which the amplifier component's characteristics may change.

10. The system of claim 6, further comprising wherein the one or more gain control element components are used with one or more constant phase shift components for adjusting the magnitude or phase of the feedback signal.

11. A method for performing amplification of an input signal using dynamic feedback comprising:
receiving an input signal, wherein the input signal is applied to an input of an amplifier;
receiving an output signal, wherein the output signal is obtained from an output of an amplifier; and
applying one or more control voltages based on a lookup table containing control voltages to be applied to the one or more gain control elements based on the input signal and one or more of the output signal, a temperature of the amplifier, a length of time the amplifier has been operating, a prior state of the input signal, a supply voltage to the amplifier, and humidity to one or more gain control elements for adjusting the magnitude of a feedback signal, wherein the one or more gain control elements are contained in one or more feedback paths coupled to an output and an input of the amplifier for conveying the feedback signal from an output signal of the amplifier to the input of the amplifier.

12. The method of claim 11, further comprising applying a second set of one or more control voltages to one or more phase shifters for adjusting the phase of a feedback signal, wherein the one or more phase shifters are contained in one or more feedback paths.

13. The method of claim 11, wherein applying one or more control voltages to one or more gain control elements allows for adjusting the phase of a feedback signal.

14. The method of claim 12, wherein applying the second set of one or more control voltages to one or more phase shifters allows for adjusting the phase of a feedback signal.

15. The method of claim 11, further comprising using a modulated signal to determine the one or more control voltages.

16. The method of claim 11, further comprising using values for the one or more control voltages for applying pre-distortion to the input signal.

* * * * *